(12) United States Patent
Kim et al.

(10) Patent No.: US 9,287,315 B2
(45) Date of Patent: Mar. 15, 2016

(54) THIN FILM TRANSISTOR ARRAY SUBSTRATE FOR DIGITAL PHOTO-DETECTOR

(71) Applicant: LG Display Co., Ltd., Seoul (KR)

(72) Inventors: Dae-Kyu Kim, Gyeongsangbuk-do (KR); Sung-Bong Ha, Daegu (KR)

(73) Assignee: LG Display Co., Ltd., Seoul (KR)

( * ) Notice: Subject to any disclaimer, the term of this patent is extended or adjusted under 35 U.S.C. 154(b) by 49 days.

(21) Appl. No.: 14/086,034

(22) Filed: Nov. 21, 2013

(65) Prior Publication Data

US 2014/0145252 A1 May 29, 2014

(30) Foreign Application Priority Data

Nov. 27, 2012 (KR) .................. 10-2012-0134962

(51) Int. Cl.
*H01L 31/115* (2006.01)
*H01L 27/146* (2006.01)
*H01L 27/30* (2006.01)

(52) U.S. Cl.
CPC ........ *H01L 27/14658* (2013.01); *H01L 27/308* (2013.01)

(58) Field of Classification Search
CPC .................. H01L 27/14658; H01L 27/14692; H01L 31/115; H01L 27/14676; H01L 27/0255; H01L 27/14625; H01L 27/14643; H01L 27/14659; H01L 27/14665; H01L 27/14678; H01L 27/307; H01L 27/308; H01L 29/786; H01L 31/085; G06T 2207/10116; H05G 1/62
See application file for complete search history.

(56) References Cited

U.S. PATENT DOCUMENTS

| | | | | |
|---|---|---|---|---|
| 4,160,165 A | * | 7/1979 | McCombs et al. | 378/19 |
| 4,868,893 A | * | 9/1989 | Hammond | 398/107 |
| 5,410,146 A | * | 4/1995 | Hur | 250/208.1 |
| 5,994,157 A | * | 11/1999 | Aggas et al. | 438/30 |
| 2005/0146648 A1 | * | 7/2005 | Yang et al. | 349/42 |

(Continued)

FOREIGN PATENT DOCUMENTS

| | | |
|---|---|---|
| CN | 101561505 A | 10/2009 |
| KR | 101035349 B1 | 11/2011 |

OTHER PUBLICATIONS

Combined Search and Examination Report dated Feb. 27, 2014 from the United Kingdom in counterpart application No. GB1317349.7.

(Continued)

*Primary Examiner* — Thomas L Dickey
*Assistant Examiner* — Gustavo Ramallo
(74) *Attorney, Agent, or Firm* — Morgan, Lewis & Bockius LLP

(57) ABSTRACT

A thin film transistor array substrate for a digital photo-detector is provided. The photo-detector includes a plurality of gate lines to supply a scan signal; a plurality of data lines to output data, the data lines arranged in a direction crossing the gate lines, wherein cell regions are defined by the gate lines and the data lines; a photodiode in each of the cell regions to perform photoelectric conversion; a thin film transistor at each intersection between the gate lines and the data lines to output a photoelectric conversion signal from the photodiode to the data lines in response to a scan signal supplied by the gate lines; and a light-shielding layer over each channel region of the respective thin film transistors. Each light-shielding layer is electrically connected to the respective gate line.

19 Claims, 8 Drawing Sheets

(56) References Cited

U.S. PATENT DOCUMENTS

2008/0245968 A1* 10/2008 Tredwell et al. ......... 250/370.09
2012/0032088 A1* 2/2012 Ishii et al. ................ 250/370.14

OTHER PUBLICATIONS

First Notification of Office Action dated Nov. 16, 2015 from The State Intellectual Property Office of China in counterpart Chinese application No. 201310454886.2.

* cited by examiner

THIN FILM TRANSISTOR ARRAY SUBSTRATE FOR DIGITAL PHOTO-DETECTOR

This application claims the benefit of Korean Patent Application No. 10-2012-0134962, filed on Nov. 27, 2012, which is hereby incorporated by reference as if fully set forth herein.

BACKGROUND OF THE INVENTION

1. Field of the Invention

The present invention relates to a digital photo-detector, and more specifically, to a thin film transistor array substrate for a digital photo-detector having reduced leakage current and noise.

2. Discussion of the Related Art

An X-ray is a short wavelength radiation that easily passes through a subject, and transmittance of X-rays depends on a density of the subject. That is, inner characteristics of the subject may be indirectly observed through amount of X-rays passing through the subject.

An X-ray detector is a device that detects an amount of X-ray passing through the subject. The X-ray detector detects transmittance of X-ray and displays the inner characteristics of the subject on a display device. The X-ray detector may be generally used as a medical inspector, a non-destructive inspector, or the like.

In recent years, a digital X-ray detector using digital radiography without using a film is widely used as an X-ray detector. Each cell of a thin film transistor array for a digital X-ray detector includes a photo-diode (PIN diode) that receives X-rays, converts the X-rays into visible light, and converts the visible light into an electric signal. A thin film transistor that is formed under the photo-diode outputs the electric signal from the photodiode to a data line.

FIG. 1 is a view illustrating a configuration of a general digital X-ray detector 100. As shown in FIG. 1, the general digital X-ray detector 100 includes a thin film transistor array substrate 110, a bias supplier 120, a gate driver 130, a readout integrated circuit 150, a timing controller 180, and a power-supply voltage supplier 190. The readout integrated circuit 150 includes a signal detector 160 and a multiplexer 170.

The thin film transistor array substrate 110 detects an X-ray emitted from an energy source, photo-electrically converts the detected X-ray into an electric signal, and outputs an electric signal. The thin film transistor array substrate 110 includes a plurality of gate lines (GL), a plurality of data lines (DL) arranged in a vertical direction to the gate lines (GL) to define respective cell regions, and a plurality of photosensitive pixels (P) arranged in a matrix form in respective cell regions by the gate lines and the data lines.

Each photosensitive pixel (P) includes a photodiode (PD) that detects an X-ray and outputs a detection signal, e.g., photo-detection voltage, and at least one switching device for outputting the detection signal from the photodiode (PD) to the data line (DL) in response to a gate pulse. For example, the switching device is a transistor. Hereinafter, a configuration in which the switching device is a transistor will be described.

The photodiode (PD) senses an X-ray emitted from an energy source and outputs the sensed signal as a detection signal. The photodiode (PD) is a device that converts incident light into an electrical detection signal through photoelectric effect and is, for example, a PIN diode having a p-type semiconductor layer, an intrinsic (I) semiconductor layer and an n-type semiconductor layer laminated in this order.

The bias supplier 120 applies a driving voltage through a plurality of bias lines (BL). The bias supplier 120 may apply a predetermined voltage to the photodiode (PD), or selectively apply a reverse bias or a forward bias thereto.

The gate driver 130 sequentially applies gate pulses having a gate-on voltage level through the gate lines (GL). In addition, the gate driver 130 may apply reset pulses having a gate-on voltage level to a plurality of reset lines (RL). The gate-on voltage level is a voltage level that turns on transistors of the photosensitive pixels (P). The transistors of the photosensitive pixels (P) may be turned on in response to the gate pulse or the reset pulse.

The detection signal output from the photodiode (PD) in response to the gate pulse is input through the data lines (DL) to the readout integrated circuit 150. The gate driver 130 may be mounted in an IC form at one side of the thin film transistor array substrate 110, or formed on a substrate, such as the thin film transistor array substrate 110, through a thin film process.

The readout integrated circuit 150 reads out the detection signal output from the turned-on transistor in response to the gate pulse. The readout integrated circuit 150 read outs a detection signal output from the photosensitive pixel P in an offset readout region to read out an offset image and in an X-ray readout region to read out a detection signal after X-ray exposure.

The readout integrated circuit 150 may include a signal detector 160 and a multiplexer 170.

The signal detector 160 includes a plurality of amplification units that correspond to the data lines (DL) one to one. Each amplification unit includes an amplifier (OP), a capacitor (CP), and a reset device (SW).

The timing controller 180 generates a start signal (STV), a clock signal (CPV) or the like, and outputs the same to the gate driver 130 in order to control operation of the gate driver 130. In addition, the timing controller 180 generates a readout control signal (ROC), a readout clock signal (CLK) or the like, and outputs the same to readout integrated circuit 150 in order to control operation of the readout integrated circuit 150. The gate driver 130 and the readout integrated circuit 150 may be operated using separate clock signals. The power-supply voltage supplier 190 supplies a power-supply voltage to the photosensitive pixels (P) through the power-supply voltage lines (VDD).

A unit cell structure of the thin film transistor array for the general digital X-ray detector will be described below.

FIG. 2 is a view illustrating a circuit configuration of a unit cell of a related art thin film transistor array substrate for a digital X-ray detector, FIG. 3 is a plan view illustrating the unit cell of the related art thin film transistor array substrate for a digital X-ray detector, and FIG. 4 is a sectional view taken along the line I-I' of the unit cell of the related art thin film transistor array substrate for a digital X-ray detector.

As shown in FIGS. 2 and 3, unit cells of the related art thin film transistor array substrate for a digital X-ray detector is defined by a plurality of gate lines (GL) to supply a scan signal, a plurality of data lines (DL) arranged in a direction vertical to the gate lines (GL) to output a data, a photodiode (e.g., a PIN-diode) formed in respective cell regions defined by the gate lines and the data lines to perform photoelectric conversion, a thin film transistor (TFT) formed at each of intersections between the gate lines (GL) and the data lines (DL) to turn on according to the scan signal of the gate lines and output the photoelectric conversion signal from the photodiode to the data lines, and a plurality of bias lines (BL) to apply a bias voltage to the respective photodiodes. As shown in FIG. 3, the data lines (DL) and the bias lines (BL) are formed parallel to each other between adjacent cells.

The cross-sectional structure of such a unit cell will be described below. As shown in FIG. 4, the gate line (represented by "GL" in FIGS. 2 and 3) and a gate electrode 2 protruding from the gate line are formed on a substrate 1, and a gate insulating film 3 is formed over the entire surface of the substrate having the gate electrode 2.

In addition, an active layer 5 is formed on the gate insulating film 3 over the gate electrode 2, and a drain electrode 4a and a source electrode 4b are formed at both sides of the active layer 5 to constitute the thin film transistor. A first interlayer insulating film 7 is formed on the entire surface of the substrate including the drain electrode 4a and the source electrode 4b, and the first interlayer insulating film 7 arranged on the source electrode 4b of the thin film transistor is selectively removed to form a first contact hole 6.

A first electrode 8 of the photodiode is formed on the first interlayer insulating film 7 such that it is connected to the source electrode 4b of the thin film transistor through the first contact hole 6. A semiconductor layer 9 having a p-type semiconductor layer, an intrinsic semiconductor layer and an n-type semiconductor layer is formed on the first electrode 8, and a second electrode 10 of the photodiode is formed on the semiconductor layer 9.

A second interlayer insulating film 11 is formed on an entire surface of the first interlayer insulating film 7 including the second electrode 10 of the photodiode, the first and second interlayer insulating films 7 and 11 arranged on the drain electrode 4a of the thin film transistor are selectively removed to form a second contact hole 16, and the second interlayer insulating film 11 arranged over the second electrode 10 of the photodiode is selectively removed to form a third contact hole 17.

On the second interlayer insulating film 11, a plurality of data lines 12 (DL) connected to the drain electrode 4a of the thin film transistor through the second contact hole 16 are formed. A light-shielding layer 13 is formed over a channel region of the thin film transistor, and a plurality of bias lines 14 (BL) connected to the second electrode 10 of the photodiode through the third contact hole 17 are formed. In addition, a protective film 15 is formed over the entire surface of the substrate.

Here, because a channel region of the thin film transistor (e.g., an active region 5 between the source electrode 4b and the drain electrode 4a) is exposed when seen from a direction in which an X-ray is transmitted, the thin film transistor generates light leakage current when X-rays are incident. Accordingly, to solve this problem, the light-shielding layer 13 is formed over the channel region of the thin film transistor. As shown in FIGS. 3 and 4, a bias voltage is applied to the light-shielding layer 13 through the bias line (BL) electrically connected thereto.

The related art thin film transistor array substrate for a digital X-ray detector having this configuration operates as follows.

When X-rays irradiates the device, current flows in the photodiode according to a light dose corresponding to the intensity of the X-rays, and when a scan signal (a gate high voltage) is applied to the gate line, the thin film transistor turns on and outputs an optical signal through the data line.

However, the related art thin film transistor array substrate for a digital X-ray detector having this configuration has the following problems.

A bias voltage (e.g., −4V) should be applied to the second electrode of the photodiode so that the digital X-ray detector can detect photocurrent corresponding to the X-ray intensity. Accordingly, the bias voltage is applied to the second electrode of the photodiode through the bias line. In addition, the bias voltage is applied to the light-shielding layer.

When the first interlayer insulating film and the second interlayer insulating film have complete insulating properties, a back channel is not formed in the thin film transistor due to the bias voltage applied to the light-shielding layer.

However, when processes are changed or the bias voltage is increased, a back channel is formed on the thin film transistor due to the light-shielding layer, a current pass is formed in the back channel of the thin film transistor, and a back channel leakage current of the thin film transistor is generated. However, a scan pulse is not supplied to the gate line in a case excluding a gate-selection region.

When a scan pulse is supplied to the gate line (gate selection region), a photocurrent of the photodiode is output to the data line through a normal channel (e.g., a channel passing through the active region) of the thin film transistor, but a current pass is formed on the back channel of the thin film transistor by the light-shielding layer, and a noise signal is thereby output to the data line.

The problems may be demonstrated through experiments. FIG. 5 is a graph showing an operation of a related art thin film transistor according to bias voltage.

For example, an initial condition is a current value of the thin film transistor in a state in which the same bias voltage (e.g., −4V) as in operation of the digital X-ray detector is applied to the bias line. Dot lines represent current values measured after bias voltages of 0 to 20V, and of 0 to −20V are applied to the bias line and a stress is applied to the back channel.

It may be ideal that the case of the initial condition and the case in which positive and negative stresses are applied to the bias electrode exhibit the same current values. However, as can be seen from FIG. 5, the initial state and the stress-applied state have different current properties. The reason for this phenomenon is that charges remain after the stress is applied to the back channel.

SUMMARY OF THE INVENTION

Accordingly, the present invention is directed to a thin film transistor array substrate for a digital photo-detector that substantially obviates one or more problems due to limitations and disadvantages of the related art.

An object of the present invention is to provide a thin film transistor array substrate for a digital photo-detector that reduces leakage current of a thin film transistor and noise of output signal by applying a gate voltage, rather than a bias voltage, to a light-shielding layer to shield a channel region of the thin film transistor.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the present invention, as embodied and broadly described herein, A thin film transistor array substrate for a digital photo-detector comprises a plurality of gate lines to supply a scan signal; a plurality of data lines to output data, the data lines arranged in a direction crossing the gate lines, wherein cell regions are defined by the gate lines and the data lines; a photodiode in each of the cell regions to perform photoelectric conversion; a thin film transistor at each intersection between the gate lines and the data lines to output a photoelectric conversion signal from the photodiode to the data lines in response to a scan signal supplied by the gate lines; and a light-shielding layer over each channel region of the respective thin film transistors, each light-shielding layer electrically connected to the respective gate line.

In another aspect, a thin film transistor array substrate for a digital photo-detector comprises a substrate, a thin film transistor disposed on the substrate, the thin film transistor including a gate electrode, a source electrode, and a drain electrode; a first interlayer insulating film disposed over the substrate and the thin film transistor, the first interlayer insulating film defining a first contact hole on the source electrode; a first electrode of a photodiode on the interlayer insulating film such that the first electrode is connected to the source electrode through the source contact hole; a semiconductor layer of the photodiode disposed on the first electrode; a second electrode of the photodiode disposed on the semiconductor layer; a second interlayer insulating film disposed on the first interlayer insulating film and the second electrode of the photodiode, a gate contact hole being defined through the first and second interlayer insulating films over the gate line; and a light-shielding layer disposed on the second interlayer insulating film over a channel region of the thin film transistor such that the light-shielding layer is connected to the gate line through the gate contact hole.

In another aspect, thin film transistor array substrate for a digital photo-detector comprises a substrate; a thin film transistor on the substrate, the thin film transistor including a gate electrode, a source electrode, and a drain electrode; a first interlayer insulating film disposed over the substrate and the thin film transistor, the first interlayer insulating film defining a source contact hole on the source electrode and defining a gate contact hole on the gate line; a first electrode of a photodiode disposed on the interlayer insulating film such that the first electrode is connected to the source electrode through the source contact hole; a light-shielding layer on the first interlayer insulating film over a channel region of the thin film transistor such that the light-shielding layer is connected to the gate line through the gate contact hole; a semiconductor layer of the photodiode disposed on the first electrode; a second electrode of the photodiode disposed on the semiconductor layer; and a second interlayer insulating film disposed on the first interlayer insulating film, the light-shielding layer, and the second electrode of the photodiode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same or similar reference numbers will be used throughout the drawings to refer to the same or like parts.

Hereinafter, a thin film transistor array substrate for a digital photo-detector according to the present invention will be described in more detail with reference to the drawings.

While examples will be given in the context of X-ray detectors, it should be readily recognized that the detector can be applied to various types of electromagnetic radiation. Thus, the following description will use X-ray detectors as an example for discussion and illustration, but applies to photo-detectors generally.

Figure 1:
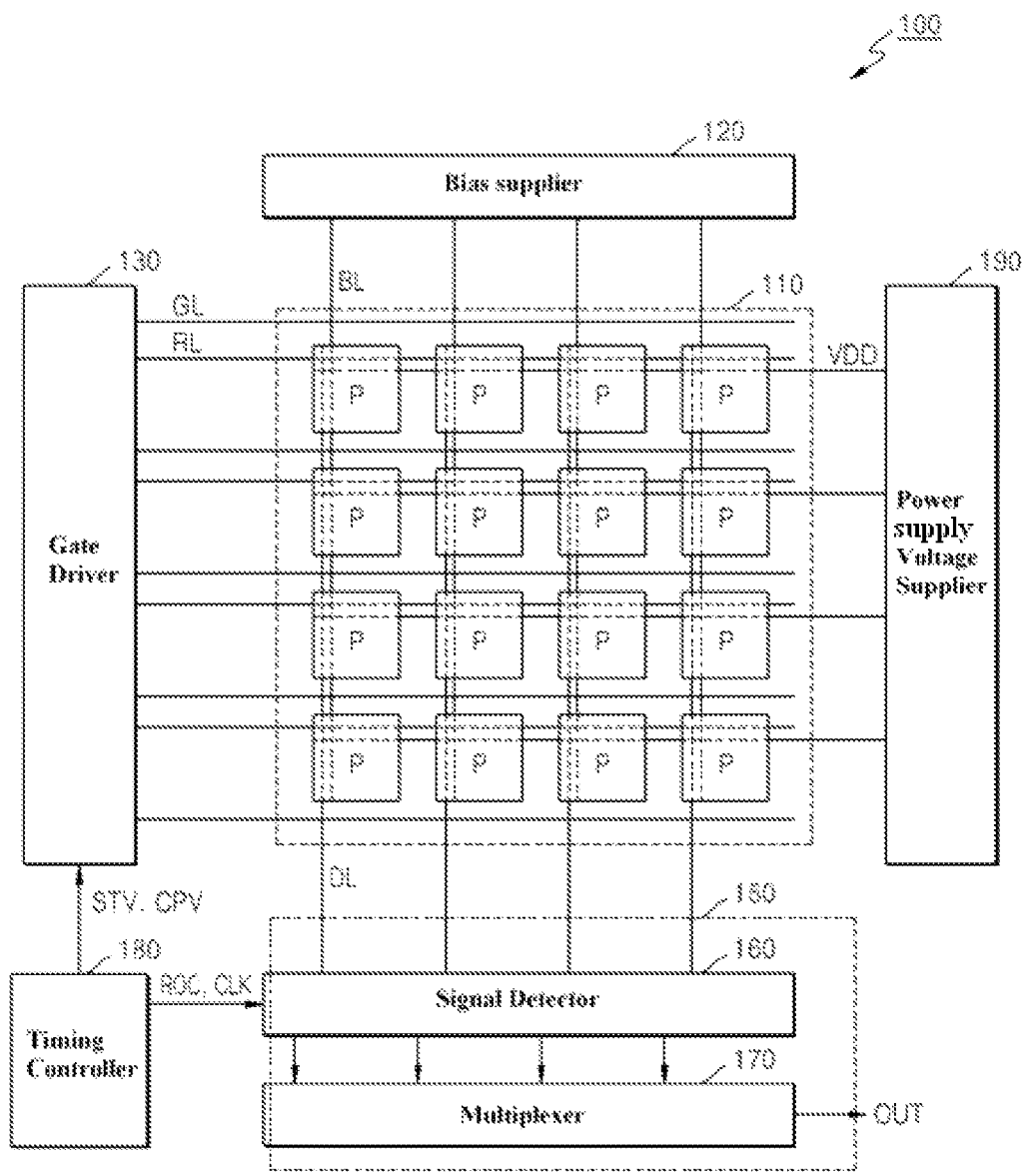
FIG. 1 is a view illustrating a configuration of a general related art X-ray detector.
Figure 2:
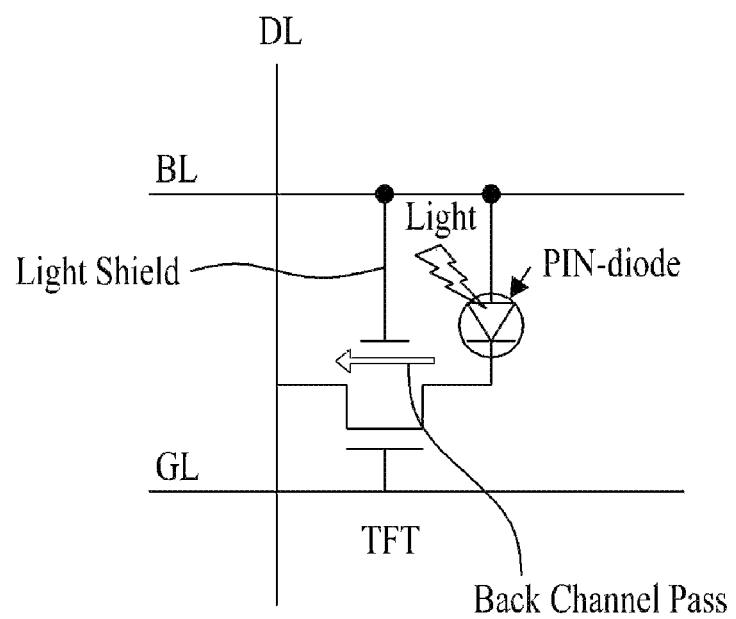
FIG. 2 is a view illustrating a circuit configuration of a unit cell of a related art thin film transistor array substrate for a digital X-ray detector.
Figure 3:
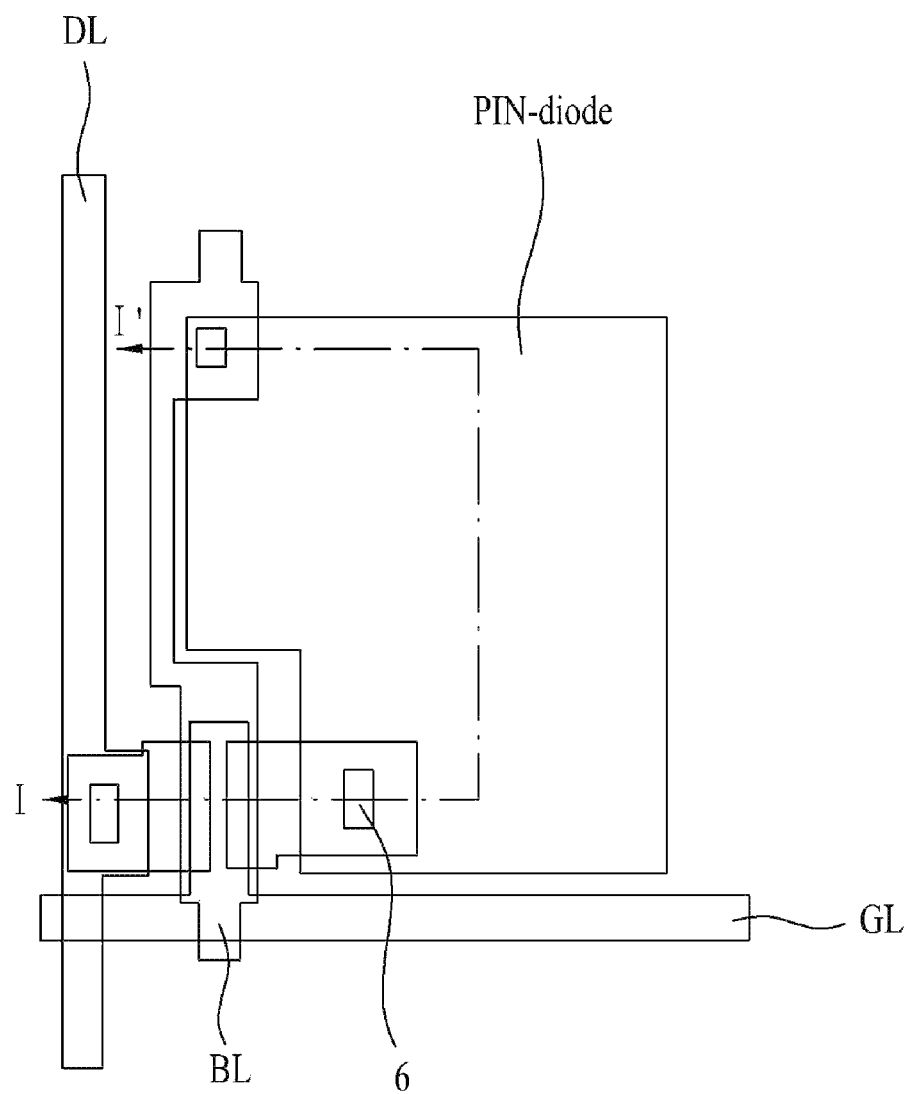
FIG. 3 is a plan view illustrating the unit cell of the related art thin film transistor array substrate for a digital X-ray detector.
Figure 4:
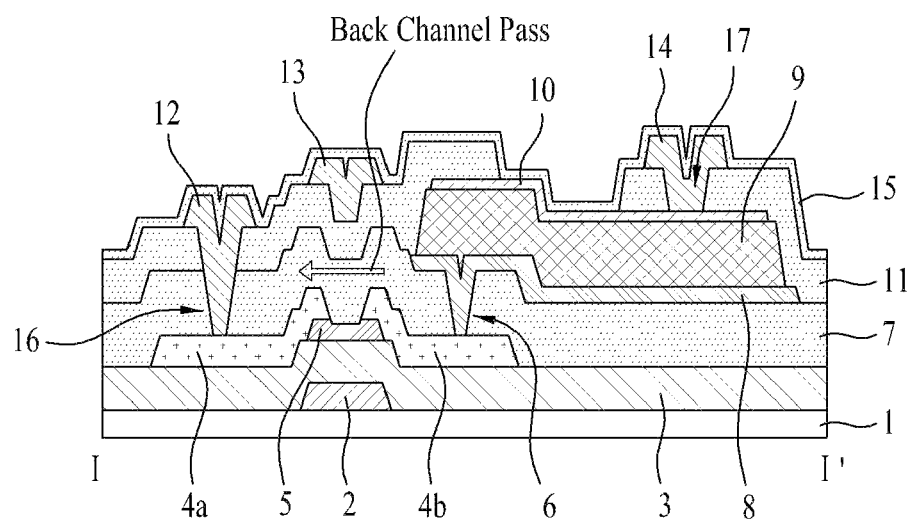
FIG. 4 is a sectional view taken along line I-I' of the unit cell of the related art thin film transistor array substrate for a digital X-ray detector shown in FIG. 3.
Figure 5:
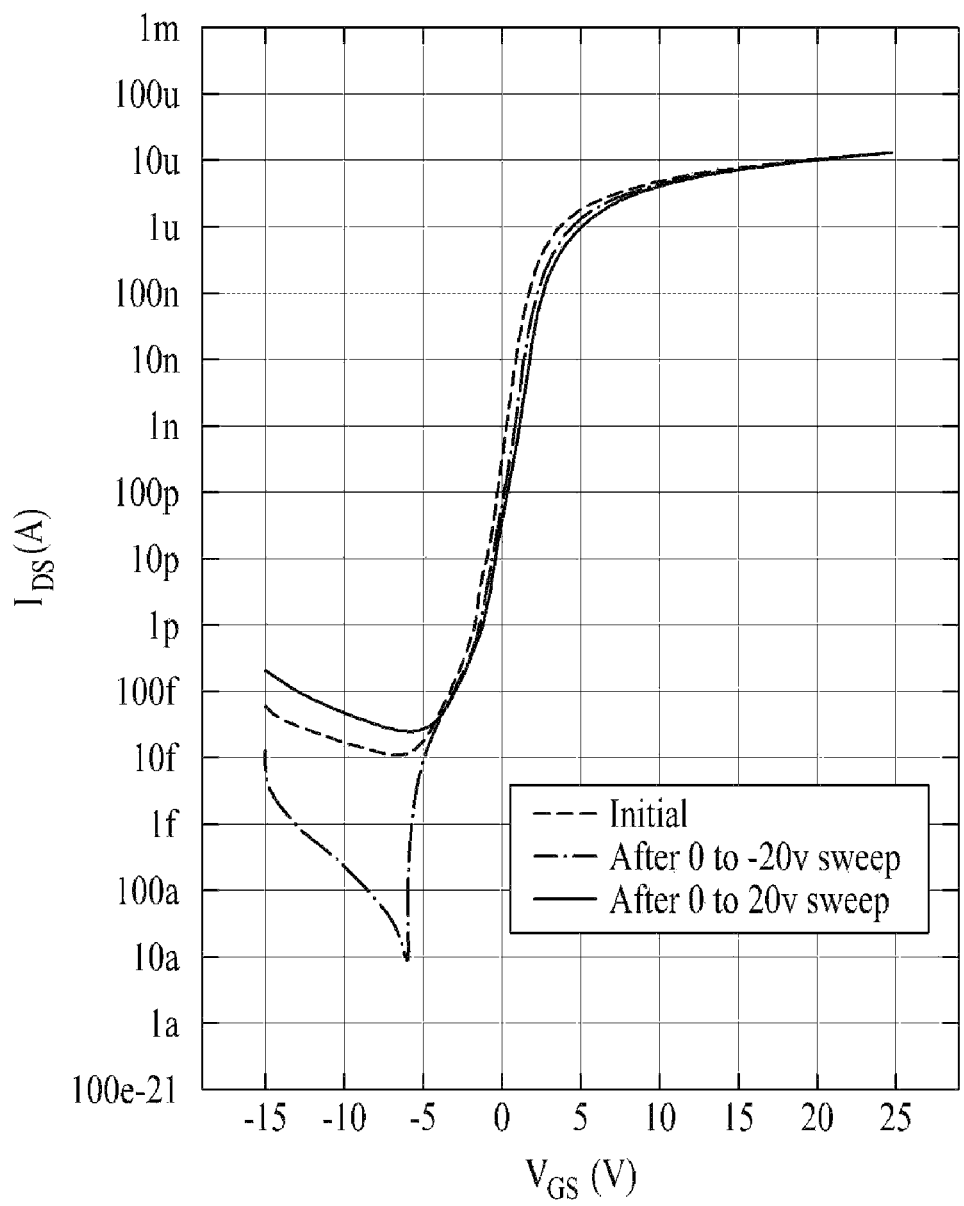
FIG. 5 is a graph showing operation characteristics of a related art thin film transistor according to bias voltage.
Figure 6:
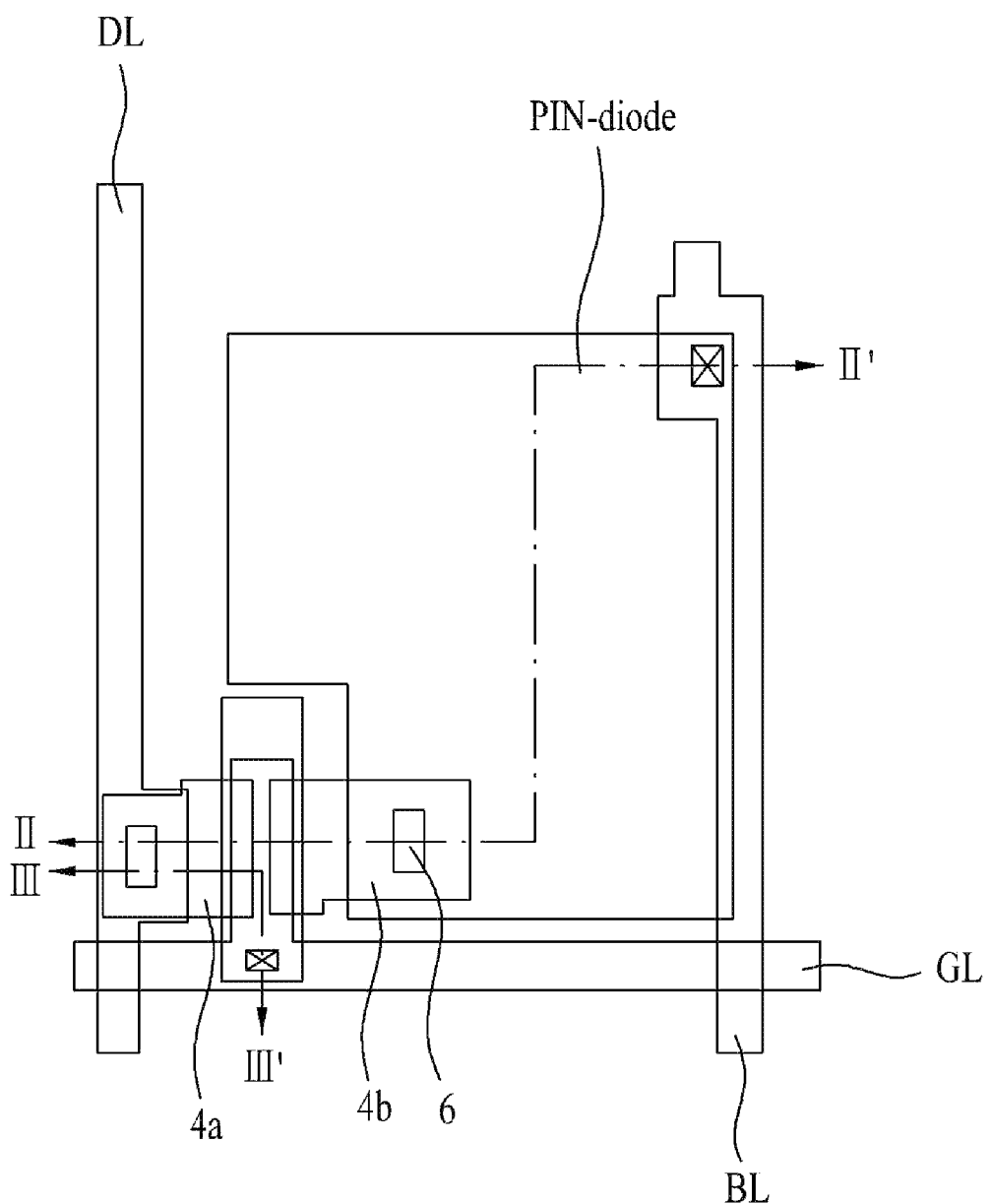
FIG. 6 is a plan view illustrating a unit cell of a thin film transistor array substrate for a digital X-ray detector according to an example configuration of the present invention.
Figure 7:
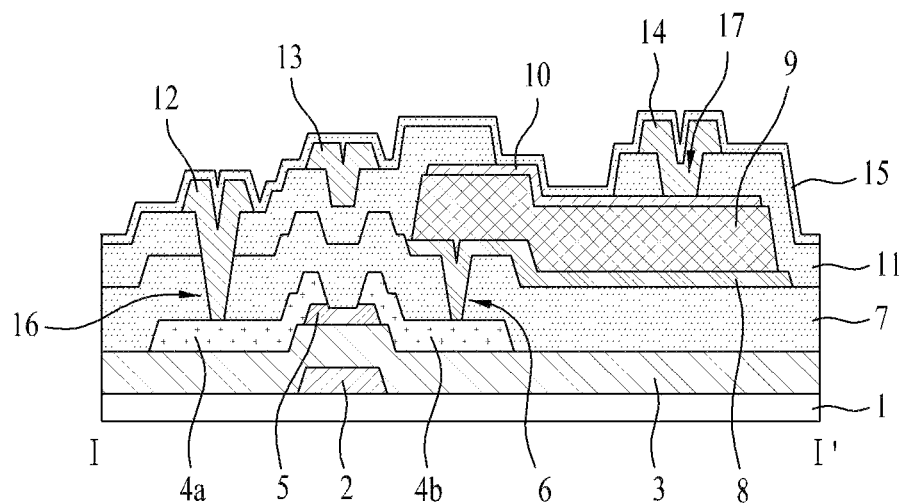
FIG. 7 is a sectional view taken along line II-II' of FIG. 6 of the unit cell of the thin film transistor array substrate for a digital X-ray detector according to the present invention shown.
Figure 8:
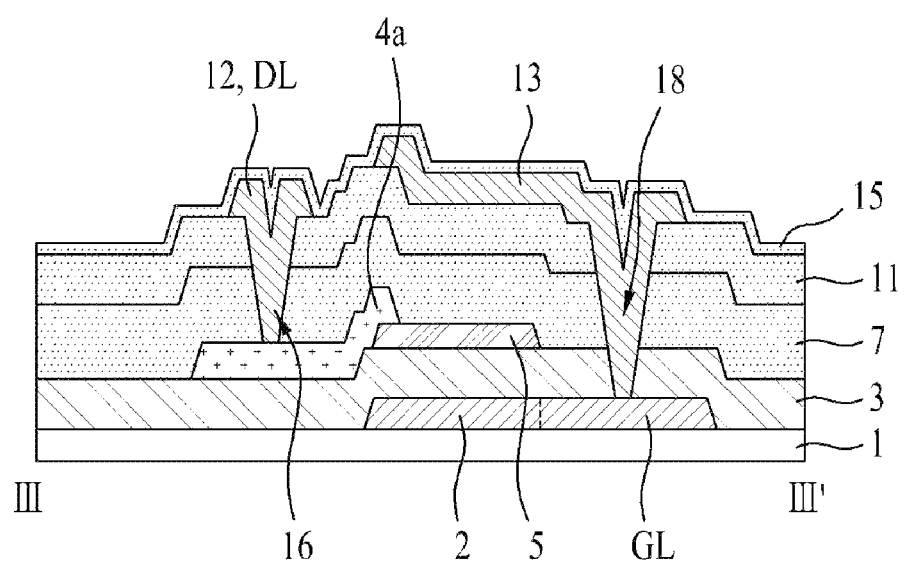
FIG. 8 is a sectional view taken along line III-III' of FIG. 6 according to a first embodiment of the present invention.
Figure 9:
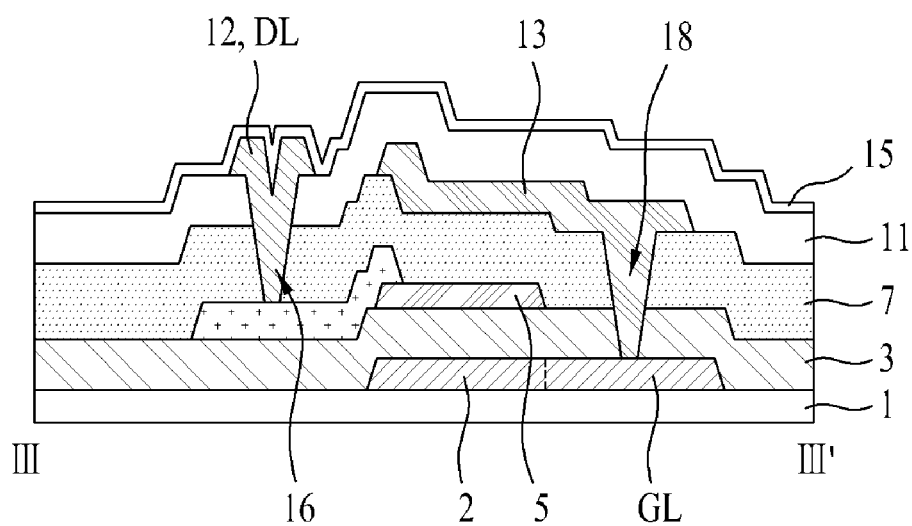
FIG. 9 is a sectional view taken along line III-III' of FIG. 6 according to a second embodiment.

FIG. 6 is a plan view illustrating a unit cell of a thin film transistor array substrate for a digital X-ray detector according to an example configuration of the present invention. FIG. 7 is a sectional view taken along line II-II' of FIG. 6. FIG. 8 is a sectional view taken along line III-III' of FIG. 6 according to a first embodiment. FIG. 9 is a sectional view taken along line III-III' of FIG. 6 according to a second embodiment.

As shown in FIG. 6, the unit cell of the thin film transistor array substrate for a digital X-ray detector includes a plurality of gate lines (GL) to supply a scan signal, a plurality of data lines (DL) arranged in a vertical direction to the gate lines (GL) to output data, a photodiode (PIN-diode) formed in each of cell regions defined by the gate lines (GL) and the data lines (DL) to perform photoelectric conversion, a thin film transistor (TFT) formed at each of intersections between the gate lines (GL) and the data lines (DL) to turn on according to the scan signal of the gate lines (GL) and output the photoelectric conversion signal from the photodiode to the data lines (DL), a plurality of bias lines (BL) to apply a bias voltage to the photodiode and a light-shielding layer 13 connected to the gate lines (GL) to shield a channel region of the thin film transistor.

The date line (DL) and the bias line (BL) are formed parallel to each other such that they are arranged at both respective sides of the photodiode.

The cross-sectional structure of such a unit cell will now be described.

First Embodiment

As shown in FIGS. 6 to 8, a gate line (GL) and a gate electrode 2 protruding from the gate line (GL) are formed on a substrate 1, and a gate insulating film 3 is formed over an entire surface of the substrate 1 having the gate line (GL) and the gate electrode 2. In addition, an active layer 5 is formed on the gate insulating film 3 over the gate electrode 2. A drain electrode 4a and a source electrode 4b are formed at both sides of the active layer 5 to constitute the thin film transistor.

A first interlayer insulating film 7 is formed on the entire surface of the substrate 1 including the drain electrode 4a and the source electrode 4b. The first interlayer insulating film 7 on the source electrode 4b of the thin film transistor is selectively removed to form a first contact hole 6 (e.g., a source contact hole).

A first electrode 8 for the photodiode is formed on the first interlayer insulating film 7 to be connected to the source electrode 4b of the thin film transistor through the first contact hole 6, a semiconductor layer 9 including a p-type semiconductor layer, an intrinsic semiconductor layer and an n-type semiconductor layer is formed on the first electrode 8, and a second electrode 10 of the photodiode is formed on the semiconductor layer 9. Here, the first electrode 8 is formed of a non-transparent or reflective metal, and the second electrode 10 is formed of a transparent conductive material.

A second interlayer insulating film 11 is formed on an entire surface of the first interlayer insulating film 7 including the second electrode 10 of the photodiode, the first and second interlayer insulating films 7 and 11 on the drain electrode 4a of the thin film transistor are selectively removed to form a second contact hole 16 (e.g., a drain contact hole), the second interlayer insulating film 11 on the second electrode 10 of the photodiode is selectively removed to form a third contact hole 17 (e.g., a bias-line contact hole), and the gate insulating film 3, the first interlayer insulating film 7, and the second interlayer insulating film 11 over the gate line (GL) are selectively removed to form a fourth contact hole 18 (e.g., a gate contact hole).

A data line 12 (DL) connected to the drain electrode 4a of the thin film transistor through the second contact hole 16 is formed on the second interlayer insulating film 11, a light-shielding layer 13 is formed over a channel region of the thin film transistor, and a bias line 14 (BL) connected to the second electrode 10 of the photodiode through the third contact hole 17 is formed. In this case, the light-shielding layer 13 is electrically connected to the gate line (GL) through the fourth contact hole 18. In addition, a protective film 15 is formed over the entire surface of the substrate 1 including the data line 12, the light-shielding layer 13, and the bias line 14.

FIG. 8 illustrates the light-shielding layer 13 formed of the same material as the data line 12 and the bias line 14, but the embodiment is not limited thereto.

Second Embodiment

As shown in FIG. 9, the light-shielding layer 13 may be formed of the same material as the first electrode 8 of the photodiode.

As shown in FIGS. 6, 7, and 9, the gate line (GL) and a gate electrode 2 protruding from the gate line are formed on a substrate 1. A gate insulating film 3 is formed on an entire surface of the substrate 1 including the gate line (GL) and the gate electrode 2.

In addition, an active layer 5 is formed on the gate insulating film 3 over the gate electrode 2. A drain electrode 4a and a source electrode 4b are formed at both sides of the active layer 5 to constitute the thin film transistor.

A first interlayer insulating film 7 is formed over the entire surface of the substrate including the drain electrode 4a and the source electrode 4b. The first interlayer insulating film 7 on the source electrode 4b of the thin film transistor is selectively removed to form a first contact hole 6, and the gate insulating film 3 and the first interlayer insulating film 7 over the gate line (GL) are selectively removed to form a fourth contact hole 18.

A first electrode 8 of the photodiode is formed on the first interlayer insulating film 7 to be connected to the source electrode 4b of the thin film transistor through the first contact hole 6. A light-shielding layer 13 is formed over the channel region of the thin film transistor to be connected to the gate line (GL) through the fourth contact hole 18.

A semiconductor layer 9 including a p-type semiconductor layer, an intrinsic semiconductor layer, and an n-type semiconductor layer structure is formed on the first electrode 8, and a second electrode 10 of the photodiode is formed on the semiconductor layer 9. Here, the first electrode 8 and the light-shielding layer 13 are formed of a non-transparent or reflective metal, and the second electrode 10 is formed of a transparent conductive material.

A second interlayer insulating film 11 is formed on an entire surface of the first interlayer insulating film 7 including the second electrode 10 of the photodiode, the first and second interlayer insulating films 7 and 11 on the drain electrode 4a of the thin film transistor are selectively removed to form a second contact hole 16, and the second interlayer insulating film 11 on the second electrode 10 of the photodiode is selectively removed to form a third contact hole 17.

A data line 12 (DL) is formed on the second interlayer insulating film 11 so that the data line 12 (DL) is connected to the drain electrode 4a of the thin film transistor through the second contact hole 16, a light-shielding layer 13 is formed on the second interlayer insulating film 11 over a channel region of the thin film transistor, and a bias line 14 (BL) is formed on the second interlayer insulating film 11 so that the bias line 14 (BL) is connected to the second electrode 10 of the photodiode through the third contact hole 17.

In addition, a protective film 15 is formed on the entire surface of the substrate 1 including the data line 12, the light-shielding layer 13 and the bias line 14.

As shown in FIGS. 6 to 9, the light-shielding layer 13 is electrically connected to the gate line (GL), rather than the bias line 14 (BL). The data line (DL) and the bias line (BL) are formed in parallel to each other, but are formed at both sides of the photodiode (PIN-diode), excluding regions provided between adjacent cells.

As apparent from the foregoing, the thin film transistor array substrate for a digital photo-detector has a number of advantages.

For example, the thin film transistor array substrate for a digital photo-detector can secure stable characteristics of a thin film transistor and improve detection properties because a light-shielding layer to shield a channel region of a thin film transistor may be electrically connected to a gate line, and the same voltage as the gate voltage of the thin film transistor may be thus applied to the light-shielding layer. Here, the signal output from the drain is not altered by a connection with the light-shielding layer because the light-shielding layer is connected to the gate.

Furthermore, the thin film transistor array substrate for a digital photo-detector can improve product reliability due to process change because the same signal as the gate signal may be applied to the light-shielding layer, even though the insulating properties of first and second interlayer insulating films are changed due to process change and a back channel is thus formed in the thin film transistor. Here, the gate voltage being applied to the light-shielding layer during a detecting period is constant. In contrast, in the related art, a voltage from the drain would be varying.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor array substrate for a digital photo-detector, comprising:
    a plurality of gate lines to supply a scan signal;
    a plurality of data lines to output data, the data lines arranged in a direction crossing the gate lines, wherein cell regions are defined by the gate lines and the data lines;
    a photodiode in each of the cell regions to perform photoelectric conversion;
    a thin film transistor at each intersection between the gate lines and the data lines to output a photoelectric conversion signal from the photodiode to the data lines in response to a scan signal supplied by the gate lines; and
    a light-shielding layer over each channel region of the respective thin film transistors, each light-shielding layer electrically connected to the respective gate line,
    wherein the photodiode includes, in order, a first electrode, a semiconductor layer, and a second electrode; and
    wherein the light-shielding layer includes the same material as the first electrode of the photodiode.

2. The thin film transistor array substrate according to claim 1, further comprising a plurality of bias lines to apply a bias voltage to respective photodiodes, wherein corresponding data lines and bias lines are formed parallel to each other at both sides of each respective photodiode.

3. The thin film transistor array substrate according to claim 1, further comprising a plurality of bias lines to apply a bias voltage to respective photodiodes, the light-shielding layer being formed of the same material as the data lines and the bias lines.

4. The thin film transistor array substrate according to claim 1, wherein the photodiode is configured to detect X-rays.

5. The thin film transistor array substrate according to claim 1, wherein the photodiode includes a PIN diode for detecting X-rays.

6. A thin film transistor array substrate for a digital photo-detector, comprising:
    a substrate,
    a thin film transistor disposed on the substrate, the thin film transistor including a gate electrode, a source electrode, and a drain electrode;
    a first interlayer insulating film disposed over the substrate and the thin film transistor, the first interlayer insulating film defining a source contact hole on the source electrode;
    a first electrode of a photodiode on the interlayer insulating film such that the first electrode is connected to the source electrode through the source contact hole;
    a semiconductor layer of the photodiode disposed on the first electrode;
    a second electrode of the photodiode disposed on the semiconductor layer;
    a second interlayer insulating film disposed on the first interlayer insulating film and the second electrode of the photodiode, a gate contact hole being defined through the first and second interlayer insulating films over the gate line; and
    a light-shielding layer disposed on the second interlayer insulating film over a channel region of the thin film transistor such that the light-shielding layer is connected to the gate line through the gate contact hole.

7. The thin film transistor array substrate according to claim 6, wherein the gate electrode protrudes from a gate line.

8. The thin film transistor array substrate according to claim 6, further comprising a data line to output data, and a bias line to apply a bias voltage to the photodiode, wherein the light-shielding layer is formed of the same material as the data lines and the bias lines.

9. The thin film transistor array substrate according to claim 6, further comprising:
    a drain contact hole defined through the first and second interlayer insulating films over the drain electrode;
    a bias-line contact hole defined through the second interlayer insulating film over the second electrode;
    a data line on the second interlayer insulating film such that the data line is connected through the drain contact hole to the drain electrode; and
    a bias line on the second interlayer insulating film such that the bias line is connected to the second electrode through the bias-line contact hole.

10. The thin film transistor array substrate according to claim 6, further comprising a data line to output data, and a bias line to apply a bias voltage to the photodiode, wherein the data line and the bias lines are formed parallel to each other at respective sides of the photodiode.

11. The thin film transistor array substrate according to claim 6, wherein the photodiode is configured to detect X-rays.

12. The thin film transistor array substrate according to claim 6, wherein the photodiode includes a PIN diode for detecting X-rays.

13. A thin film transistor array substrate for a digital photo-detector, comprising:
    a substrate;
    a thin film transistor on the substrate, the thin film transistor including a gate electrode, a source electrode, and a drain electrode;
    a first interlayer insulating film disposed over the substrate and the thin film transistor, the first interlayer insulating film defining a source contact hole on the source electrode and defining a gate contact hole on the gate line;
    a first electrode of a photodiode disposed on the interlayer insulating film such that the first electrode is connected to the source electrode through the source contact hole;
    a light-shielding layer on the first interlayer insulating film over a channel region of the thin film transistor such that the light-shielding layer is connected to the gate line through the gate contact hole;
    a semiconductor layer of the photodiode disposed on the first electrode;
    a second electrode of the photodiode disposed on the semiconductor layer; and
    a second interlayer insulating film disposed on the first interlayer insulating film, the light-shielding layer, and the second electrode of the photodiode.

14. The thin film transistor array substrate according to claim 13, wherein the gate electrode protrudes from a gate line.

15. The thin film transistor array substrate according to claim 13, wherein the light-shielding layer is formed of the same material as the first electrode of the photodiode.

16. The thin film transistor array substrate according to claim 13, further comprising:
- a drain contact hole defined through the first and second interlayer insulating films over the drain electrode;
- a bias-line contact hole defined through the second interlayer insulating film over the second electrode;
- a data line on the second interlayer insulating film such that the data line is connected through the drain contact hole to the drain electrode; and
- a bias line on the second interlayer insulating film such that the bias line is connected to the second electrode through the bias-line contact hole.

17. The thin film transistor array substrate according to claim 13, further comprising a data line to output data, and a bias line to apply a bias voltage to the photodiode, wherein the data line and the bias lines are formed parallel to each other at respective sides of the photodiode.

18. The thin film transistor array substrate according to claim 13, wherein the photodiode is configured to detect X-rays.

19. The thin film transistor array substrate according to claim 13, wherein the photodiode includes a PIN diode for detecting X-rays.

* * * * *